United States Patent
Roethlingshoefer

(10) Patent No.: US 8,115,589 B2
(45) Date of Patent: Feb. 14, 2012

(54) METHOD FOR PRODUCING AN ELECTRICAL RESISTOR ON A SUBSTRATE

(75) Inventor: Walter Roethlingshoefer, Rentlingen (DE)

(73) Assignee: Robert Bosch GmbH, Stuttgart (DE)

( * ) Notice: Subject to any disclaimer, the term of this patent is extended or adjusted under 35 U.S.C. 154(b) by 379 days.

(21) Appl. No.: 12/304,295

(22) PCT Filed: Nov. 2, 2007

(86) PCT No.: PCT/EP2007/061831
§ 371 (c)(1),
(2), (4) Date: Aug. 4, 2009

(87) PCT Pub. No.: WO2008/077671
PCT Pub. Date: Jul. 3, 2008

(65) Prior Publication Data
US 2010/0039213 A1  Feb. 18, 2010

(30) Foreign Application Priority Data
Dec. 21, 2006 (DE) .......................... 10 2006 060 634

(51) Int. Cl.
*H01C 1/012* (2006.01)

(52) U.S. Cl. ......... 338/308; 338/20; 338/332; 29/610.1; 428/680; 428/433

(58) Field of Classification Search .................. 338/308, 338/20–21, 332, 314, 325; 29/620, 610.1, 29/829–830; 428/620, 680, 668, 433–434
See application file for complete search history.

(56) References Cited

U.S. PATENT DOCUMENTS

| | | | |
|---|---|---|---|
| 4,464,420 A | 8/1984 | Taguchi et al. | |
| 5,221,644 A | 6/1993 | Berlin et al. | |
| 5,345,212 A | 9/1994 | Brown | |
| 5,889,445 A * | 3/1999 | Ritter et al. | 333/172 |
| 5,966,067 A | 10/1999 | Murakami et al. | |
| 6,127,052 A * | 10/2000 | Tomari et al. | 428/680 |
| 6,316,726 B1 * | 11/2001 | Hidaka et al. | 174/538 |
| 7,012,501 B2 * | 3/2006 | Krumphals et al. | 338/21 |
| 2005/0205195 A1 | 9/2005 | Berry et al. | |

FOREIGN PATENT DOCUMENTS

| | | |
|---|---|---|
| DE | 1 646 874 | 9/1971 |
| DE | 19780905 | 9/1998 |
| DE | 199 53 594 | 5/2000 |
| DE | 101 44 364 | 4/2003 |
| DE | 698 29 018 T2 | 3/2006 |
| EP | 0 415 571 | 3/1991 |
| EP | 0 417 749 | 3/1991 |
| GB | 2 231 558 | 7/1998 |
| JP | 7-320534 | 12/1995 |
| JP | 8-153945 | 6/1996 |

* cited by examiner

*Primary Examiner* — Kyung Lee
(74) *Attorney, Agent, or Firm* — Kenyon & Kenyon LLP

(57) ABSTRACT

A method for producing an electrical resistor, in particular a current sensing resistor, on a substrate, a resistor blank being placed on the substrate and then being heat-treated to form the resistor. To form the resistor blank, a palladium layer is applied to the substrate and a silver layer is applied to the palladium layer, or a silver layer is applied to the substrate and a palladium layer is applied to the silver layer, and the palladium of the palladium layer is then completely alloyed with the silver of the silver layer by heat treatment.

16 Claims, 1 Drawing Sheet

METHOD FOR PRODUCING AN ELECTRICAL RESISTOR ON A SUBSTRATE

FIELD OF THE INVENTION

The present invention relates to a method for producing an electrical resistor, in particular a current sensing resistor, on a substrate, a resistor blank being placed on the substrate and then being heat-treated to form the resistor.

BACKGROUND INFORMATION

It is known to produce electrical resistors, in particular current sensing resistors, on substrates. This is done in particular using thick-film technology and LTCC technology (LTCC=low temperature co-fire ceramics). To this end, silver-palladium pastes are imprinted on the substrate using silkscreen printing. The integration of such resistors, designed in particular as conductor path resistors, having typical resistance values of 100 mOhms, for example, and temperature coefficient values of 100 ppm/K, for example, requires a high process expenditure, such as connecting this resistor to conductor paths with high silver content and low resistance; at the same time it is necessary to apply intermediate alloys (intermediates), which requires additional imprinting and heat treatment steps. Such intermediate steps are often not even possible, due to the layout of the production lines. The imprinted silver-palladium pastes, which represent a pre-mixed resistance, are tempered, i.e., heat-treated, to finish the resistor.

SUMMARY OF THE INVENTION

Based on the method according to the invention for producing an electrical resistor, in particular a current sensing resistor, on a substrate, a resistor blank is placed on the substrate and is then heat-treated to form the resistor, a palladium layer being applied to the substrate to form the resistor blank and then a silver layer being applied to the palladium layer. Alternatively, a silver layer is applied to the substrate and a palladium layer is applied to the silver layer. That is followed by heat treatment, so that the palladium of the palladium layer alloys completely with the silver of the silver layer. This alloy then constitutes the desired resistor, in particular a current sensing resistor. This resistor is produced in what is known as a co-fire process, i.e., in situ; that is, the electrical resistor is produced from the resistor blank on-site during the tempering step. Hence there is a decisive difference from the earlier process, since an alloy is formed to create the resistor because of the heat treatment, namely due to the complete alloying of separate layers, whereas in the related art silver-palladium paste that is finished before the tempering process is employed and is tempered after it is applied, in particular by silkscreen printing. The parameters of the resistor are set by choosing an appropriate quantity of palladium relative to the quantity of silver.

In this way both the resistance value and the temperature coefficient (TC value) are able to be set in a desired manner. The temperature coefficient specifies the number of ohms by which each ohm of the resistance changes per ° K. When the method according to the invention is used, no diffusion zones arise, in particular when adjacent connection zones make contact, and there is also assurance that no Kirkendall voids will form. Such diffusion zones with formation of voids result in reliability problems due to drifting, or even conductor path breaks. It is especially significant that the palladium is applied separately, and that the resistance value is set—together with the silver—by alloying in the co-fire process. In contrast, a completely mixed silver-palladium paste is typically used, which is applied with additional steps such as printing and tempering and with which contact is made through additionally applied intermediate alloys at the connection zones.

According to a refinement of the exemplary embodiments and/or exemplary methods of the present invention it is provided that the palladium layer and/or the silver layer are/is applied by a printing process. In particular, the printing process is carried out as silkscreen printing. In the silkscreen process, the palladium layer is applied first and the silver layer is applied on top of it.

It is also advantageous if the silver layer extends beyond the palladium layer to the sides to form electrical connection zones. Thus the alloy forms only in the overlap range of the silver and palladium, and the projecting silver layer sections are able to be used to form electrical connection zones, which may be connected to silver-plated through contacts of the substrate.

It is also advantageous if a glass cover layer is applied to the resistor blank. This may be printed on, in particular by silkscreen printing, the glass cover layer being applied before heat treatment. Hence this is glass that has not yet been tempered and is then tempered by heat treatment. The glass cover layer protects the electrical resistor.

According to a refinement of the exemplary embodiments and/or exemplary methods of the present invention it is provided that the palladium layer is applied to the substrate with an adhesion promoter interposed in at least some places. Thus in such a case the palladium layer is on the substrate, that is, not directly but with the adhesion promoter interposed, so that the palladium layer is held reliably on the substrate. The palladium layer is then provided with the silver layer.

It is advantageous if the layers are designed as conductor path layers. Accordingly, they are structures that are similar in design to conductor paths, i.e., a segment of the conductor path forms the aforementioned electrical resistor, in particular a current sensing resistor. The glass cover layer may also be similar in design to a conductor path, not in that there is electrical conductivity present in the glass cover layer, but in that the glass cover layer has the form of a conductor path.

It is also advantageous if the adhesion promoter is likewise applied by a printing process, in particular by a silkscreen printing process.

Furthermore, it is advantageous if the method employs thick-film technology.

The substrate used may be in particular a ceramic substrate; in particular it may be LTCC ceramic, i.e., low temperature co-fired ceramic. The ceramic substrate may be formed by a plurality of ceramic films layered on top of each other. There may be conductor path layers between the ceramic films, so that a multi-layer conductor path structure results.

According to a refinement of the exemplary embodiments and/or exemplary methods of the present invention it is provided that the electrical connection zones are designed as plated through contacts, in particular silver-plated through contacts (silver vias).

Finally, the invention relates to a substrate having an electrical resistor, in particular a current sensing resistor, the production taking place according to the method mentioned above.

The drawing illustrates the exemplary embodiments and/or exemplary methods of the present invention on the basis of an exemplary embodiment.

BRIEF DESCRIPTION OF THE DRAWING

The FIGURE shows a cross section of a substrate provided with an electrical resistor, in particular a current sensing resistor.

DETAILED DESCRIPTION

Figure 1:
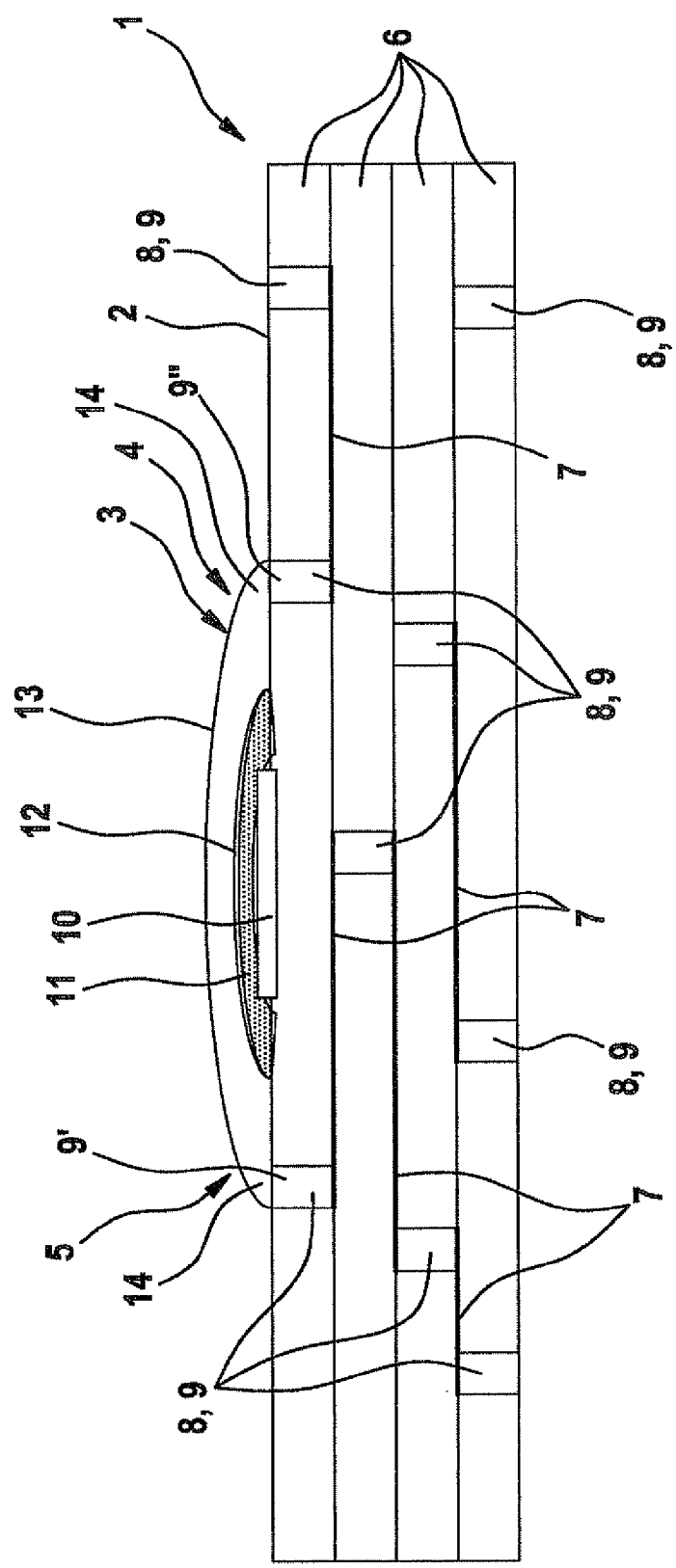

The FIGURE shows a substrate 1 of electrically insulating material, an electrical resistor 3, in particular a current sensing resistor 4, being situated on top side 2 of the substrate. In the FIGURE, resistor 3 is still shown as a resistor blank 5, which is transformed into resistor 3 by a processing step—as described below. The term "current sensing resistor" means that a flow of current is detected by this resistor, so that a statement may be made about the flow of that current.

Substrate 1 has a multi-layer design, i.e., it has a plurality of layers 6 between which conductor paths 7 are situated. Conductor paths 7 may be connected with each other electrically by plated through contacts 8. Plated through contacts 8 may be silver-plated through contacts 9. Substrate 1 may be a ceramic substrate, individual layers 6 being formed of ceramic films.

In order to form resistor 3 between silver contacts 9' and 9", first an adhesion promoter 10, in particular a palladium adhesion promoter 11, is applied to top side 2 of the substrate. The application may be accomplished by silkscreen printing. Over adhesion promoter 10 a palladium layer 12 in the form of a conductor path is then applied, in particular printed, which may be by silkscreen printing. Palladium adhesion promoter 11 ensures that palladium layer 12 is joined sufficiently firmly with top side 2 of substrate 2. Next a silver layer 13 is applied over palladium layer 12, in particular printed, which may be by the silkscreen printing method. At the same time a structure corresponding to a conductor path is produced in such a way that the two silver-plated through contacts 9' and 9" are connected with each other. Palladium layer 12 is shorter than silver layer 13, i.e., silver layer 13 extends laterally beyond the palladium layer, in order to form electrical connection zones 14 to silver-plated through contacts 9' and 9".

After the work steps mentioned above, resistor 3 is heat-fused together with the substrate in the form of a multi-layer ceramic using a baking process, i.e., in a common tempering step; that is, the palladium of palladium layer 12 is completely alloyed with the silver of silver layer 13. Depending on the quantity of palladium chosen, the desired target values are set with regard to the specific resistance and/or temperature coefficient of resistor 3.

In addition, it is possible before the tempering step to apply a glass cover layer over silver layer 13, which forms a protective layer for resistor 3 after the tempering step.

As shown above, the separate application of palladium and silver prepares for the setting of the resistance value according to the chosen quantities, and resistor 3, in particular current sensing resistor 4, is formed during the subsequent alloy formation in the co-fire, connection zones 4 being produced in particular at the same time, and electrically connected to corresponding opposing elements, for example silver-plated through contacts 9' and 9".

What is claimed is:

1. A method for producing an electrical current sensing resistor on a substrate, the method comprising:
    forming a resistor blank on the substrate by performing one of (i) applying a palladium layer to the substrate and a silver layer to the palladium layer, and (ii) applying a silver layer to the substrate and a palladium layer to the silver layer; and
    heat treating the palladium of the palladium layer so as to completely alloy it with the silver of the silver layer by the heat treatment, the heat treatment of the resistor blank forming the resistor.

2. The method of claim 1, wherein at least one of the palladium layer and the silver layer is applied by a printing process.

3. The method of claim 1, wherein the printing process is carried out as silkscreen printing.

4. The method of claim 1, wherein the printing process is carried out as ink-jet printing.

5. The method of claim 1, wherein the silver layer extends laterally beyond the palladium layer to form electrical connection zones.

6. The method of claim 1, wherein a glass cover layer is applied to the resistor blank.

7. The method of claim 1, wherein the glass cover layer is printed on.

8. The method of claim 1, wherein the glass cover layer is applied before heat treatment.

9. The method of claim 1, wherein an adhesion promoter is interposed when the palladium layer is applied to the substrate.

10. The method of claim 1, wherein the adhesion promoter is applied by a printing process.

11. The method of claim 1, wherein the layers are applied as conductor path layers.

12. The method of claim 1, wherein the production is accomplished using thick-film technology.

13. The method of claim 1, wherein a ceramic substrate is used as the substrate.

14. The method of claim 1, wherein the ceramic substrate is formed from ceramic films.

15. The method of claim 1, wherein the electrical connection zones are designed as plated through contacts.

16. A substrate having an electrical current sensing resistor, comprising:
    a resistor blank on the substrate, the resistor blank having been formed by one of (i) a palladium layer having been applied to the substrate and a silver layer to the palladium layer, and (ii) a silver layer having been applied to the substrate and a palladium layer to the silver layer, the palladium of the palladium layer having been heat treated so as to completely alloy it with the silver of the silver layer by the heat treatment, the heat treatment of the resistor blank forming the resistor.

\* \* \* \* \*